(12) United States Patent
Hsuan et al.

(10) Patent No.: US 8,159,075 B2
(45) Date of Patent: Apr. 17, 2012

(54) SEMICONDUCTOR CHIP STACK AND MANUFACTURING METHOD THEREOF

(75) Inventors: John Hsuan, Hsinchu (TW); Tai-Sheng Feng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 74 days.

(21) Appl. No.: 12/641,333

(22) Filed: Dec. 18, 2009

(65) Prior Publication Data

US 2011/0147909 A1    Jun. 23, 2011

(51) Int. Cl.
*H01L 23/60* (2006.01)
*H01L 21/98* (2006.01)

(52) U.S. Cl. ........ 257/777; 257/621; 257/686; 257/774; 257/778; 257/E21.597; 257/E21.705; 257/E23.169; 257/E25.03

(58) Field of Classification Search ............. 257/621, 257/686, 774, 777, 778, E21.597, E21.705, 257/E23.169, E25.03
See application file for complete search history.

(56) References Cited

U.S. PATENT DOCUMENTS

| | | |
|---|---|---|
| 4,841,355 A | 6/1989 | Parks |
| 7,215,033 B2 | 5/2007 | Lee et al. |
| 2002/0074637 A1* | 6/2002 | McFarland ............ 257/686 |
| 2005/0104181 A1* | 5/2005 | Lee et al. ............... 257/686 |
| 2007/0007639 A1* | 1/2007 | Fukazawa ............. 257/686 |
| 2008/0133809 A1* | 6/2008 | Saito et al. ............ 710/106 |
| 2009/0040861 A1* | 2/2009 | Ruckerbauer ....... 365/230.03 |
| 2010/0214812 A1* | 8/2010 | Kim ..................... 365/51 |

* cited by examiner

*Primary Examiner* — Eugene Lee
*Assistant Examiner* — Peniel M Gumedzoe
(74) *Attorney, Agent, or Firm* — Winston Hsu; Scott Margo

(57) ABSTRACT

A semiconductor chip stack includes a first chip and a second chip. The first chip includes a first circuit formed in the first chip with a first integration density, and the second chip includes a second circuit in the second chip with a second integration density smaller than the first integration density. The first chip further includes at least a through-silicon via formed therein for electrically connecting the first chip and the second chip.

12 Claims, 7 Drawing Sheets

US 8,159,075 B2

SEMICONDUCTOR CHIP STACK AND MANUFACTURING METHOD THEREOF

BACKGROUND OF THE INVENTION

1. Field of the Invention

The present invention relates to a semiconductor chip stack and manufacturing method thereof, and more particularly, to a semiconductor chip stack having through-silicon via (TSV) and manufacturing method thereof.

2. Description of the Prior Art

Integrated circuit (IC) products are constructed by chips that are fabricated by conventional semiconductor manufacturing processes. The processes to fabricate a chip start with a wafer: a plurality of regions is defined on a wafer. Then, conventional semiconductor manufacture processes such as deposition, photolithography, etching or planarization are performed to form the desired circuit trace(s) and followed by separating each region to form a plurality of chips. Chips are packaged to form a chip package; and the chip package is attached on a board such as a printed circuit board (PCB). It is also well-known that the chip is electrically connected to pins on the PCB and thus each of the programs on the chip can be performed.

Pursuing thinner and lighter IC products, the semiconductor industries always tries to reach the limits to the process miniaturization, and to develop different package technologies. For example, flip-chip (FC) technology, multi-chip package (MCP) technology, package on package (PoP) technology, package in package (PiP) technology are developed to stack the chips or packages in three dimensions, therefore density of the semiconductor devices per unit volume is increased. In recent years, a "through-silicon via (TSV)" technique is further developed to improve interconnections between chips in the package so as to increase the package efficiency.

Please refer to FIGS. 1-2, which are schematic drawings of a conventional IC product. Left of FIG. 1 is a schematic drawing of a wafer; and right of FIG. 1 is an enlarged view of a region in the wafer of FIG. 1. As shown in FIG. 1, IC product is fabricated by providing a wafer 100 having a plurality of regions 102 defined thereon. Then different semiconductor processes are performed to the wafer 100, and the required semiconductor devices are formed in each region 102. The regions are separated to form chips possessing a specific function. As shown in the right of FIG. 1, when a region 102 is predetermined to be a dynamic random access memory (DRAM) chip, memory core array is formed in a center region of each region 102, and a sub-region 104 with a high device integration density is obtained. In the meantime, a peripheral circuit or I/O pads are formed in a peripheral region of each region 102, and a sub-region 106 with a low device integration density is obtained. Therefore each region 102 includes both of the sub-region 104 of high integration density and the sub-region 106 of low integration densities. When the regions 102 of different wafers 100 are predetermined to form chips possessing different specific function, such as analog chip, flash memory chip, or CPU chip, the region 102 is formed to include many sub-regions 104/106 of high or low integration densities.

After separating the regions 102 to obtain the chips, the prior art is to stack and package the chips with different specific function, thus a semiconductor chip package 110 is obtained. As shown in FIG. 2, the conventional chip package 110 includes a carrier 112, a CPU chip 114a, a DRAM chip 114b, a flash memory chip 114c, and an analog chip 114d upwardly stacked on the carrier 112. And the active surfaces of each chip in the package 110 are electrically connected by TSV 116.

As mentioned above, the conventional chips respectively possess one specific function, and each chip comprises kinds of semiconductor devices in the sub-regions with different integration densities. However, the devices are formed by the same processes. For example, to comply with the process requirement for fabricating the devices with high integration density, high-grade semiconductor processes are performed to the wafer even though the devices with low integration density need no such high-grade semiconductor processes. In fact, devices with different integration densities require processes of different grades. Therefore, wastes of cost and source have been caused when the semiconductor processes are performed to the wafer 100. Consequently, a semiconductor chip stack and manufacturing method that is able to improve process efficiency and to lower the cost is still in need.

SUMMARY OF THE INVENTION

It is therefore a primary objective of the present invention to provide a semiconductor chip stack and manufacturing method that is able to improve process efficiency and to lower the cost.

According to the claimed invention, a semiconductor chip stack is provided. The semiconductor chip stack comprises a first chip having a first circuit of a first integration density formed therein and a second chip having a second circuit of a second integration density formed therein, the second integration density is smaller than the first integration density. The first chip further comprises at least a TSV formed therein for electrically connecting the first chip and the second chip.

According to the claimed invention a method of manufacturing a semiconductor chip stack is provided. The method comprises steps of providing a circuit layout of a function device, the circuit layout further comprising a first device layout and a second device layout, and an integration density of the first device layout is larger than an integration density of the second device layout; defining a plurality of first chip regions on a first wafer and forming the first device layout in each first chip region; defining a plurality of second chip regions on a second wafer and forming the second device layout respectively corresponding to the first device layout in each second chip region; respectively forming a plurality of first TSVs in the first wafer for electrically connecting the first device layout and the second device layout; and respectively cutting the first wafer and the second wafer to form a plurality of first chips and a plurality of second chips.

According to the semiconductor chip stack and manufacturing method provided by the present invention, circuit layouts of one specific function device are respectively formed on different chips according to the integration density, and then the chips are electrically connected by TSV technology. Thus the desired specific function is obtained. Since different chips are to be formed with different integration densities, processes of high-grade or low-grade is performed to form the chips according to its integration density. Therefore the process efficiency is improved while the cost is lowered.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
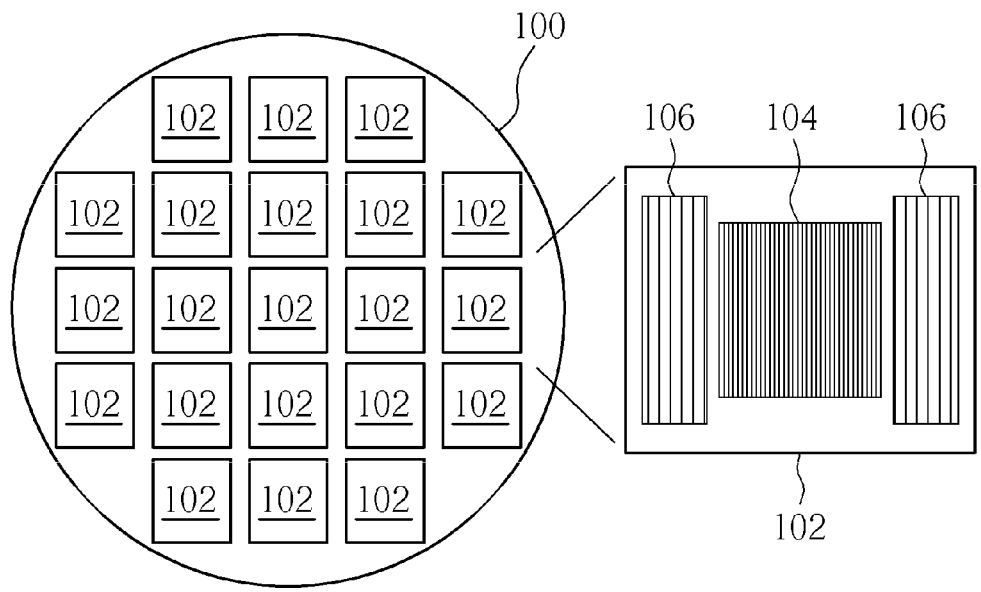
FIGS. 1-2 are schematic drawings of a conventional IC product.
Figure 2:
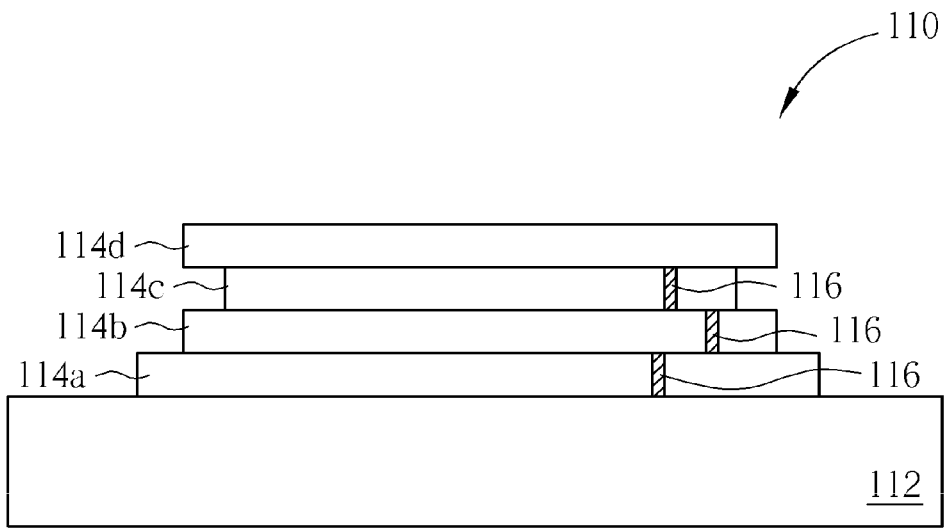
Figure 3:
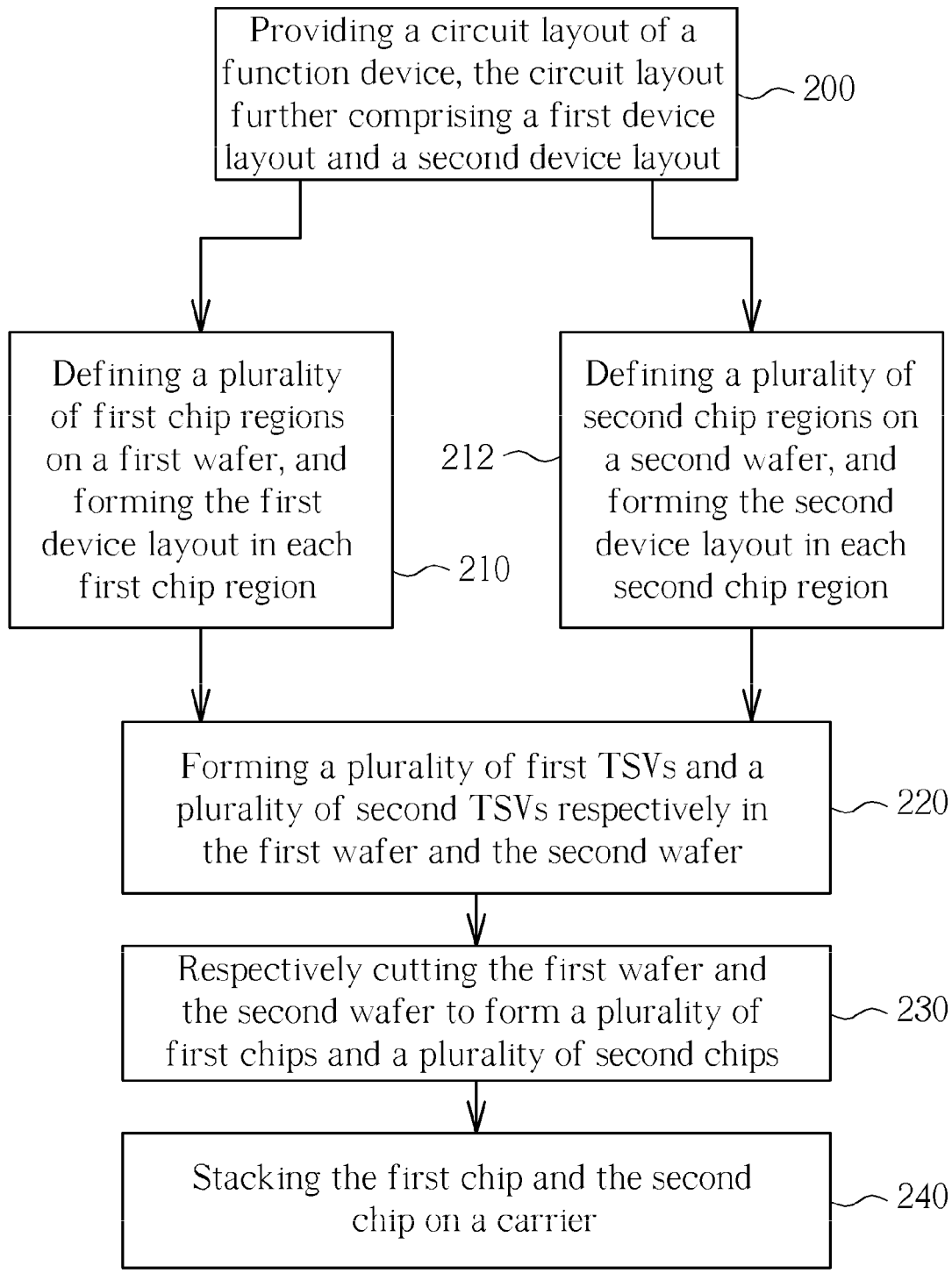
FIG. 3 is a flowchart illustrating a method of manufacturing a semiconductor chip stack provided by a first preferred embodiment of the present invention.
Figure 4:
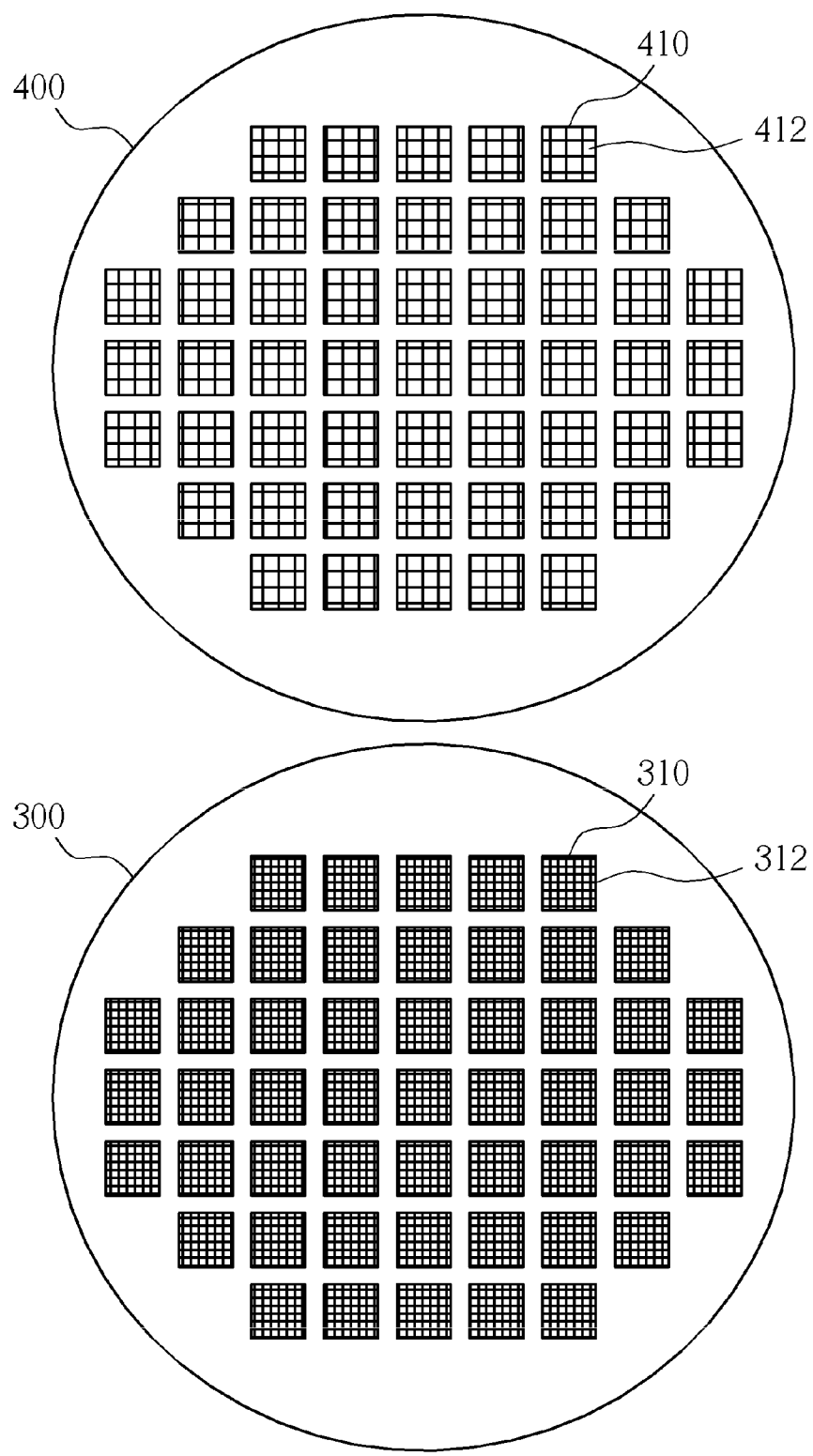
FIGS. 4-6 are schematic drawings illustrating the first preferred embodiment.
Figure 5:
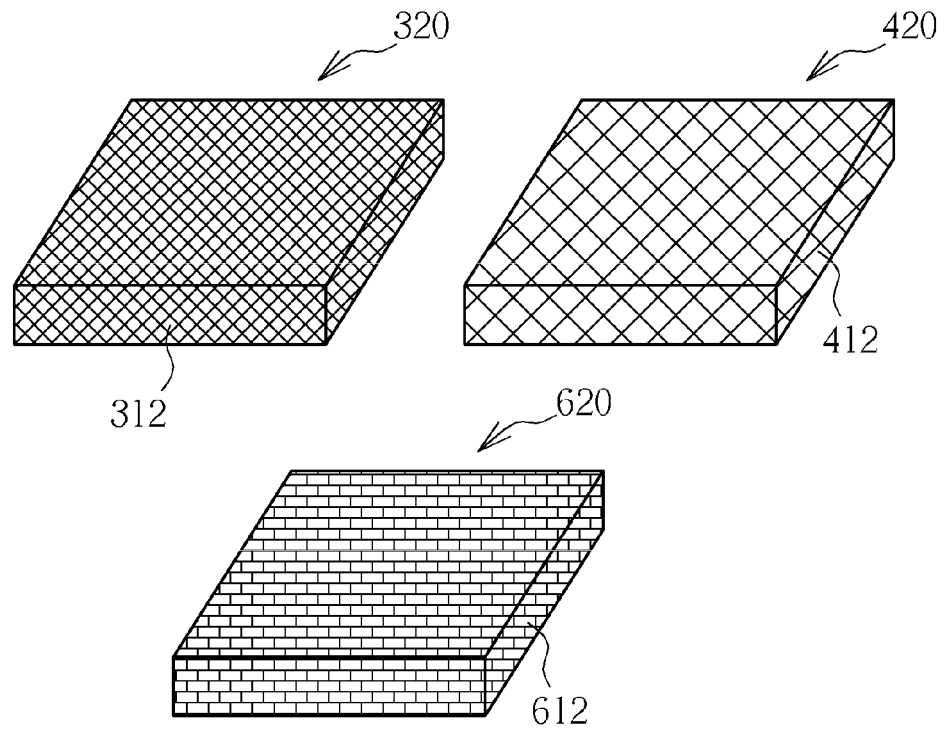
Figure 6:
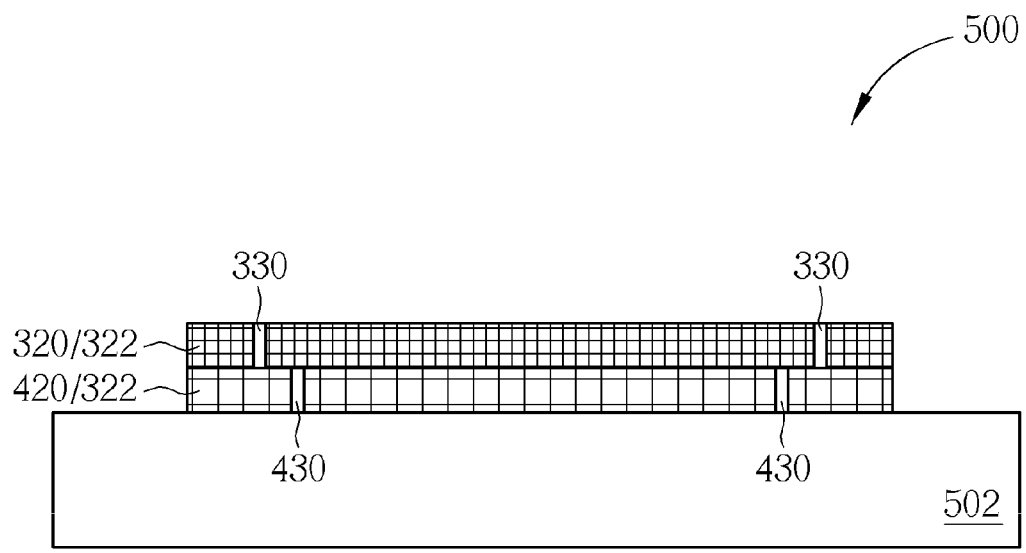

Please refer to FIGS. 3-6, FIG. 3 is a flowchart illustrating a method of manufacturing a semiconductor chip stack provided by a first preferred embodiment of the present invention, and FIGS. 4-6 are schematic drawings illustrating the first preferred embodiment. As shown in FIG. 3, the method of manufacturing a semiconductor chip stack provided by the first preferred embodiment includes steps of:

Step 200: providing a circuit layout of a function device, the circuit layout further comprising a first device layout 312 and a second device layout 412.

In the first preferred embodiment, the function device includes a memory device such as a dynamic random access memory (DRAM) or a NAND-type non-volatile memory. It is well-known to those skilled in the art that the circuit layout of the DRAM or the NAND-type non-volatile memory further includes a memory core array layout which comprises higher integration density, and a peripheral circuit layout having logic circuits, electrostatic discharge (ESD) protection devices and I/O pads, which comprises lower integration density. In the first preferred embodiment, the first device layout is the memory core array layout of higher integration density and the second device layout is the peripheral circuit layout of lower integration density.

Please refer to FIGS. 3-4. After Step 200, Step 210 and Step 212 are performed:

Step 210: defining a plurality of first chip regions 310 on a first wafer 300, and forming the first device layout 312 in each first chip region 310;

Step 212: defining a plurality of second chip regions 410 on a second wafer 400, and forming the second device layout 412 in each second chip region 410;

It is noteworthy that Step 210 and Step 212 are performed to form the first device layout 312 and second device layout 412 on the first wafer 300 and the second wafer 400 respectively, therefore Step 210 and Step 212 can be performed simultaneously or sequentially by the related semiconductor processes. Since the integration densities of the first device layout 312 and the second device layout 412 are different, the first device layout 312 with higher integration density is formed on the first wafer 300 by high-grade processes, and the second device layout 412 with lower integration density is formed on the second wafer 400 by low-grade processes.

Please refer to FIG. 3 and FIG. 5. After performing the semiconductor processes, Step 220 and Step 230 are performed:

Step 220: forming a plurality of first TSVs 330 and a plurality of second TSVs 430 respectively in the first wafer 300 and the second wafer 400.

Step 230: respectively cutting the first wafer 300 and the second wafer 400 to form a plurality of first chips 320 and a plurality of second chips 420.

According to Step 220 of the first preferred embodiment, the first TSVs 330 (shown in FIG. 6) are formed in the first chip region 310 and the second TSVs 430 (also shown in FIG. 6) are formed in the second chip region 410. It is well-known to those skilled in the art that TSV process can be performed at different time point among the whole semiconductor processes or the packaging processes. The TSV process used to form the first TSVs 330 and the second TSVs may be divided into two types, namely the via-first or the via-last process. The via-first process is performed before or after forming CMOS, or after the back-end-of-line process while the via-last process is performed in the packaging process. Therefore the Step 220 can be performed in Step 210/212, after Step 210/212, or after Step 230 depending on the process requirement.

According to Step 230, the obtained first chip 320 and the second chip 420 respectively comprises the first device layout 312 and the second device layout 412. In other words, the first chip 320 comprises a memory core array of a DRAM or an NAND-type non-volatile memory while the second chip 420 comprises a peripheral circuit of the aforementioned memory, such as logic circuits, ESD protection devices and I/O pads. Thus, the second chip 420 serves as a global interface chip.

Please refer to FIG. 3 and FIG. 6. After individualizing the first chip 320 and the second chip 420, Step 230 is performed:

Step 230: stacking the first chip 320 and the second chip 420 on a carrier 502.

As shown in FIG. 6, a packaging process is performed: the first chip 320 and the second chip 420 are stacked on the carrier 502 and packaged to form a semiconductor chip 500. Although the second chip 420 is positioned between the first chip 320 and the carrier 502 in FIG. 6, it is easily realized that the structural relationship between the first chip 320 and the second chip 420 is not limited to this.

According to the first preferred embodiment, the provided semiconductor chip stack 500 comprises a first chip 320 having a first circuit 312 of a first integration density formed therein and a second chip 420 having a second circuit 412 of a second integration density formed therein. The first chip 320 and the second chip 420 respectively comprise at least a first TSV 330 and at least a second TSV 430. As mentioned above, the first circuit 312 comprises a core array of a memory such as DRAM or NAND-type non-volatile memory. The second circuit 412 is corresponding to the first circuit 312, and comprises logic circuits, ESD protection devices and I/O pads of the memory. Additionally, the first chip 320 and the second chip 420 are not limited to comprise micro electro-mechanical systems (MEMS) structures.

As mentioned above, the core circuit and the peripheral circuit of a function device such as DRAM or NAND-type non-volatile memory are respectively fabricated on different chips according to its integration densities, and followed by packaging process. The chips respectively comprise the core circuit and the peripheral circuit are then electrically connected by TSVs to obtain the desired specific function. Since different chips are to be formed with different integration densities, high-grade or low-grade processes are performed to fabricate the chips according to its integration density. Therefore the process efficiency is improved while the cost is lowered.

Figure 7:
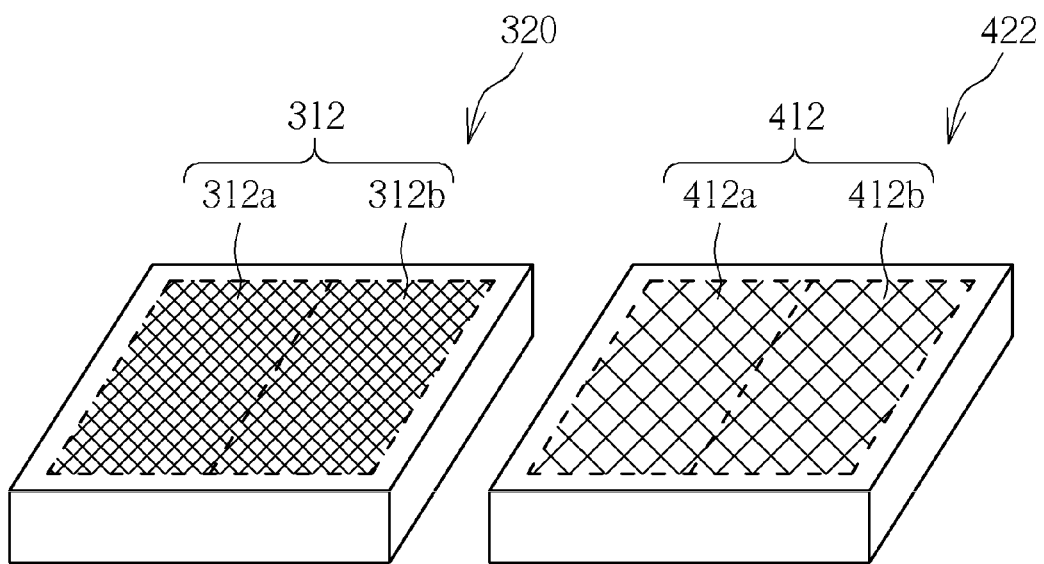
FIG. 7 is a schematic drawing illustrating a second preferred embodiment of the present invention.

Please refer to FIG. 7, which is a schematic drawing illustrating a second preferred embodiment of the present invention. Since steps in the second preferred embodiment are the same with the first preferred embodiment, those steps are omitted herein.

Please refer to FIG. 3. In Step 210, a plurality of first chip regions 310 is defined on the first wafer 300, and each of the first chip regions 310 comprises a first device layout 312.

Different from the first preferred embodiment, the first device layout 312 further comprises a core array of a first memory 312a and a core array of a second memory 312b in the second preferred embodiment. The first memory and the second memory can be different memories. For example, the first memory is a DRAM and thus the core array of a first memory 312a is a DRAM core array; the second memory is a NAND-type non-volatile memory and thus the core array of a second memory 312b is a NAND-type non-volatile memory core array. Furthermore, a plurality of chip regions 410 are defined on the second wafer 400 and each of the second chip regions 410 comprises a second device layout 412. The second device layout 412 comprises a peripheral circuit 412a having logic circuits, ESD protection devices and I/O pads of the DRAM and a peripheral circuit 412b having logic circuits, ESD protection devices and I/O pads of the NAND-type non-volatile memory.

Please refer to FIG. 3 and FIG. 6. In the second preferred embodiment, TSV processes for forming a plurality of first TSVs 330 (shown in FIG. 6) and a plurality of second TSVs 430 (shown in FIG. 6) described in Step 220 are performed to the first wafer 300 and the second wafer 400 in Step 210/212, after Step 210/212, or after Step 230. Then Step 230 is performed: cutting the first wafer 300 and the second wafer 400 to form a plurality of first chips 322 and a plurality of second chips 422. The first chip 322 and the second chip 422 are stacked on the carrier 502 and packaged to form a semiconductor chip stack 500 as disclosed in Step 230 and FIG. 6.

According to the second preferred embodiment, the first device layout 312 formed on the first chip 322 comprises at least two different core circuits 312a/312b, which are core arrays of the first memory and the second memory. And the peripheral circuits 412a/412b comprising logic circuits, ESD protection devices and I/O pads of the first memory and the second memory are formed in the second chip 422. The core circuits and the peripheral circuits of function devices are respectively fabricated on different chips according to its integration densities, and followed by packaging process. The chips respectively comprise the core circuit and the peripheral circuit are then electrically connected by TSVs to obtain the desired specific function. According to the second preferred embodiment, the first chip 322 is fabricated to comprise core arrays of different memories, therefore function of the semiconductor chip 500 is enhanced. Since different chips are to be formed with different integration densities, high-grade or low-grade processes are performed to fabricate the chips according to its integration density. Therefore the process efficiency is improved while the cost is lowered.

Figure 8:
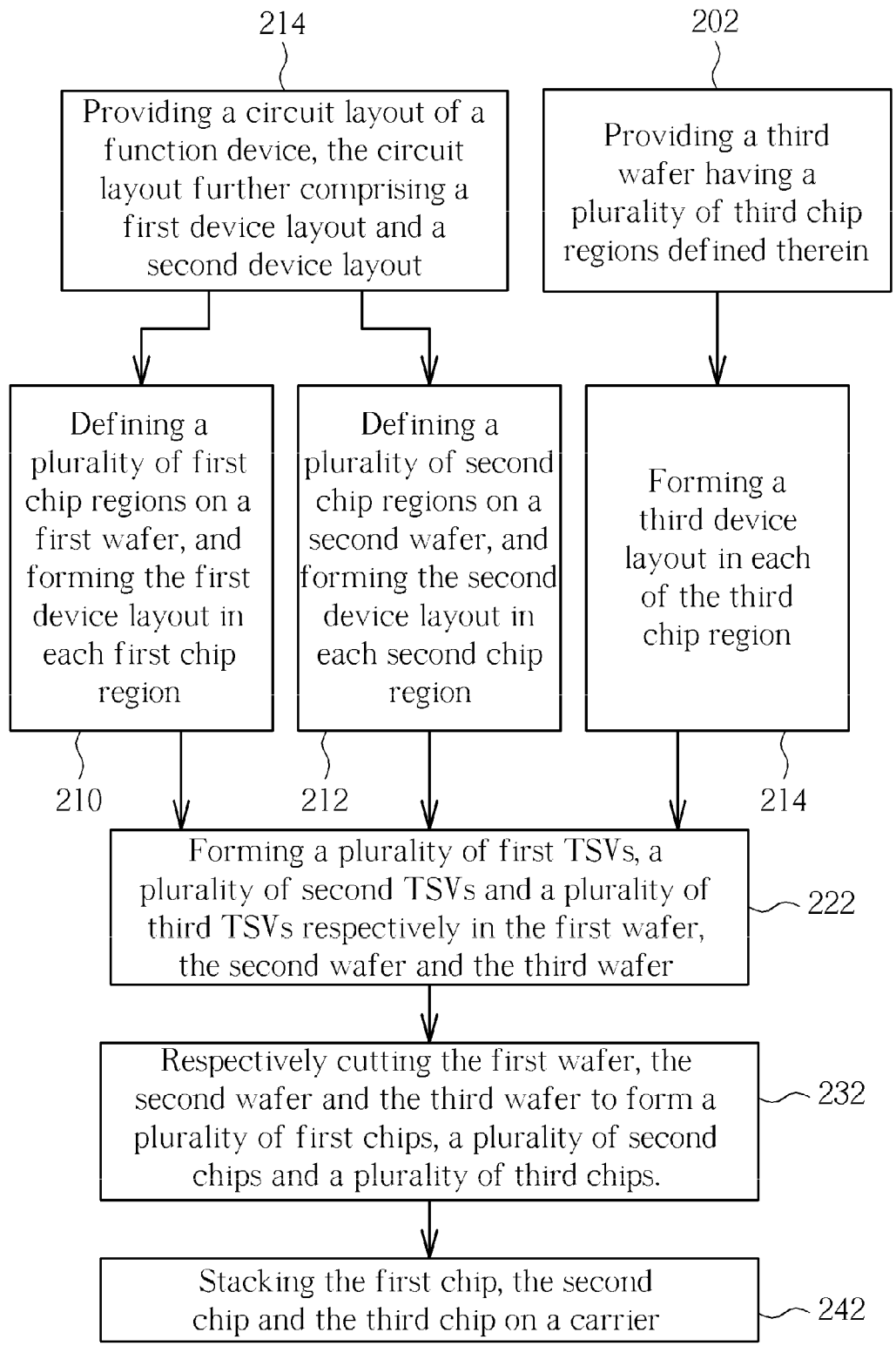
FIG. 8 is a flowchart illustrating a method of manufacturing a semiconductor chip stack provided by a third preferred embodiment of the present invention.
Figure 9:
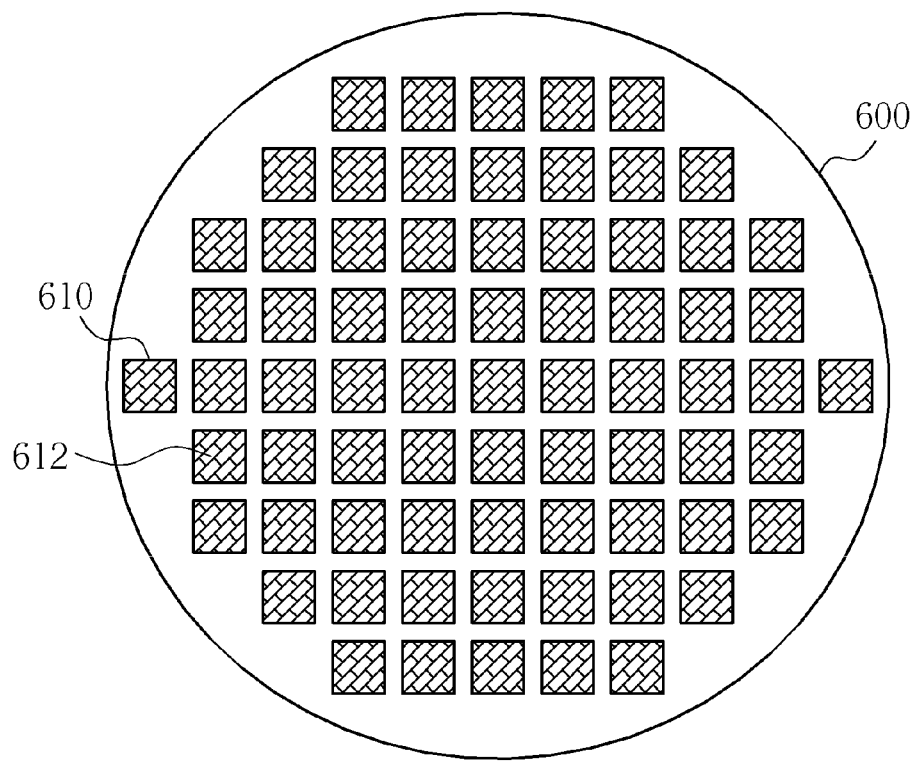
FIGS. 9-10 are schematic drawings illustrating the third preferred embodiment.
Figure 10:
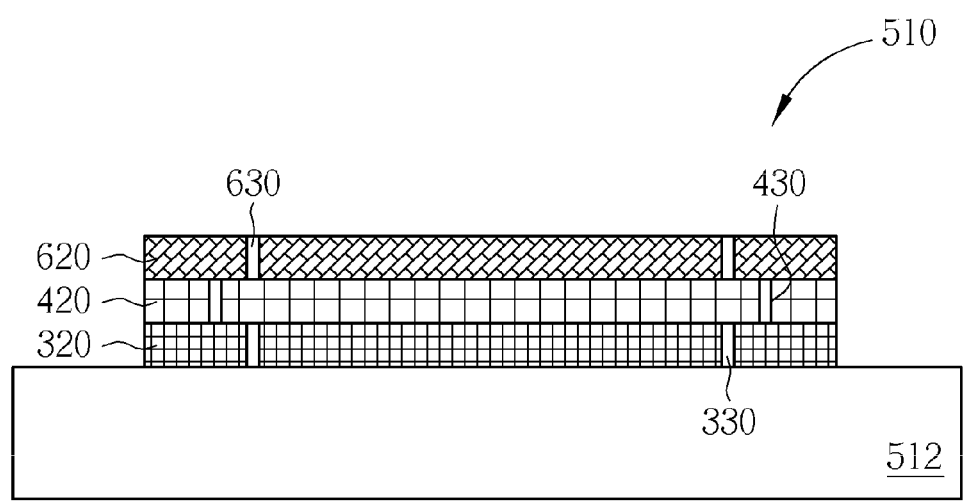

Please refer to FIGS. 8-10, FIG. 8 is a flowchart illustrating a method of manufacturing a semiconductor chip provided by a third preferred embodiment of the present invention, and FIGS. 9-10 are schematic drawings illustrating the third preferred embodiment. Because Step 200, Step 210 and Step 212 are the same in the first and the third preferred embodiment, those steps and details are disclosed in FIGS. 3-5 and thus omitted herein.

Please refer to FIG. 8. According to the third preferred embodiment, Step 200 is performed to provide a circuit layout of a function device, and the circuit layout further comprises a first device layout 312 and a second device layout 412. Then Step 202 and Step 214 are further performed:

Step 202: providing a third wafer 600 having a plurality of third chip regions 610 defined therein.

Step 214: As shown in FIG. 9, forming a third device layout 612 in each of the third chip region 610.

It is noteworthy that an integration density of the third device layout 612 is larger than an integration density of the second device layout 412. The first device layout 312 and the third device layout 612 respectively comprises a core array of a first memory and a core array of a third memory. For example, the first device layout 312 is a DRAM core array and the third device layout 612 is an NAND-type non-volatile memory core array. In a modification of the third preferred embodiment, both of the first device layout 312 and the third device layout 612 comprise a core array of a first memory and a core array of a third memory. For example, both of the first device layout 312 and the third device layout 612 comprise a DRAM core array and an NAND-type non-volatile memory core array. Thus the first device layout 312 and the third device layout 612 comprise same memory core arrays. According to the third preferred embodiment, the second device layout 412 comprises a peripheral circuit having logic circuits, ESD protection devices and I/O pads of the first memory and another peripheral circuit having logic circuits, ESD protection devices and I/O pads of the third memory.

Step 222: forming a plurality of first TSVs 330, a plurality of second TSVs 430 and a plurality of third TSVs 630 respectively in the first wafer 300, the second wafer 400 and the third wafer 600.

Step 232: As shown in FIG. 5, cutting the first wafer 300, the second wafer 400 and the third wafer 600 respectively to form a plurality of first chips 320, a plurality of second chips 420 and a plurality of third chips 620.

According to Step 222, the first TSVs 330 are formed in the first chip region 310, the of second TSVs 430 are formed in the second chip region 410, and a plurality of third TSVs 630 are formed in the third chip region 610 as shown in FIG. 10. As mentioned above, the TSV process can be performed at different time point among the whole semiconductor processes and packaging processes, therefore Step 232 is performed in Step 210/212/214, after Step 210/212/214, or after Step 222.

Because the second device layout 412 comprises the peripheral circuits of the first memory and the second memory, the second chip 420 serves as a global interface chip of the first chip 320 and the third chip 620.

Step 242: As shown in FIG. 10, stacking the first chip 320, the second chip 420 and the third chip 620 on a carrier 512.

The first chip 320, the second chip 420 and the third chip 620 are stacked on the carrier 512 and packaged to form a semiconductor chip stack 510. In the third preferred embodiment, the second chip 420, which servers as the global interface chip, is positioned between the first chip 320 and the third chip 620, but not limited to this.

According to the third preferred embodiment, the provided semiconductor chip stack 510 comprises a first chip 320 having a core circuit 312 of a first integration density formed therein, a third chip 620 having a core circuit 612 of the first integration density formed therein, and a second chip 420 having a peripheral circuit 412 of a second integration density formed therein, and the peripheral circuit 412 is corresponding to the core circuits 312/612. The first chip 320, the second chip 420 and the third chip 620 respectively comprise at least a first TSV 330, at least a second TSV 430 and at least a third TSVs 630. As mentioned above, the core circuit 312/612 comprises core array of memories such as DRAM or NAND-type non-volatile memory while the peripheral circuit 314 comprises logic circuits, ESD protection devices and I/O pads of the abovementioned memories. Additionally, the first chip 320, the second chip 420 and the third chip 620 are not limited to comprise MEMS structures.

It is noteworthy that the core arrays of higher integration density are fabricated in the first chip 320 and the third chip 620 and the peripheral circuit of lower integration density is fabricated in the second chip 420. Therefore the semiconductor processes of high-grade are performed to the first chip 320 and the third chip 620 while the semiconductor processes of low-grade are performed to the second chip 420. Accordingly, process efficiency is improved.

According to the semiconductor chip stack and manufacturing method provided by the present invention, circuit layouts of one function device are respectively form on different chips according to the integration density, then the chips are electrically connected by FC, MCP, or preferably TSV technology. Thus the desired specific function is obtained. Since different chips are to be formed with different integration densities, processes of high-grade or low-grade is performed to form the chips according to its integration density. Therefore the process efficiency is improved while the cost is lowered. Furthermore, because TSV technology is adapted in the present invention, the provided method of manufacturing a semiconductor chip stack also can be used in different package technologies such chip-to-chip, chip-to-wafer or wafer-to-wafer processes.

Those skilled in the art will readily observe that numerous modifications and alterations of the device and method may be made while retaining the teachings of the invention.

What is claimed is:

1. A semiconductor chip stack comprising:
a first chip having a first circuit of a first integration density formed therein; and
a second chip having a second circuit of a second integration density formed therein, the second integration density is smaller than the first integration density; wherein the second circuit comprises logic circuits, electrostatic discharge (ESD) protection devices and I/O pads of a first memory of the first circuit; and the first chip further comprises at least a through-silicon via (TSV) formed therein for electrically connecting the firs chip and the second chip.

2. The semiconductor chip stack of claim 1, wherein the second chip further comprises at least a second TSV.

3. The semiconductor chip stack of claim 1, wherein the first circuit comprises a core array of the first memory.

4. The semiconductor chip stack of claim 1, wherein the first circuit further comprises at least a core array of a second memory.

5. The semiconductor chip stack of claim 4, wherein the second circuit further comprises logic circuits, ESD protection devices, and I/O pads respectively of the second memory.

6. The semiconductor chip stack of claim 1 further comprising a third chip having a third circuit with a third integration density formed therein.

7. The semiconductor chip stack of claim 6, wherein the third integration density is larger than the second integration density.

8. The semiconductor chip stack of claim 6, wherein the third chip further comprises at least a third TSV.

9. The semiconductor chip stack of claim 6, wherein the first circuit and the third circuit respectively comprise a core array of the first memory and a core array of a third memory, and the first memory is different from the third memory.

10. The semiconductor chip stack of claim 9, wherein the second circuit further comprises logic circuits, ESD protection devices and I/O pads respectively of the third memory.

11. The semiconductor chip stack of claim 6, wherein the first circuit and the third circuit comprise same memory core arrays.

12. The semiconductor chip stack of claim 11, wherein the logic circuits, the ESD protection devices and the I/O pads of the second circuit are corresponding to the memory core arrays.

* * * * *